United States Patent

Tamura

[11] Patent Number: 5,958,636
[45] Date of Patent: Sep. 28, 1999

[54] PATTERN DRAWING METHOD USING CHARGED PARTICLE BEAMS

[75] Inventor: Takao Tamura, Tokyo, Japan

[73] Assignee: NEC Corporation, Tokyo, Japan

[21] Appl. No.: 08/967,157

[22] Filed: Nov. 10, 1997

[30] Foreign Application Priority Data

Nov. 11, 1996 [JP] Japan ..................................... 8-298677

[51] Int. Cl.$^6$ ...................................................... G03F 9/00
[52] U.S. Cl. .............................. 430/30; 430/296; 430/942
[58] Field of Search ............................... 430/30, 296, 942

[56] References Cited

U.S. PATENT DOCUMENTS

| | | | |
|---|---|---|---|
| 5,667,923 | 9/1997 | Kanata | 430/296 |
| 5,736,281 | 4/1998 | Watson | 430/296 |

FOREIGN PATENT DOCUMENTS

| | | |
|---|---|---|
| 59-167018 | 9/1984 | Japan . |
| 5-217869 | 8/1993 | Japan . |

Primary Examiner—Christopher G. Young

[57] ABSTRACT

Each of two pattern scheduled areas to be formed a pattern is divided into two areas of an outer edge section and a central section surrounded by the outer edge section. Further, the outer edge section which is in contact with a space area is divided into outline portions from both end portion of the outer edge section, with a 5 $\mu$m distance. An outline portion is formed at a portion of the outer edge section sandwiched by the outline portions. An outline portion is formed at a position of the outer edge section orthogonal with these outline portions. Next, a suitable exposure level to each of the divided outline portions is controlled by a controlling unit based on the intensity of electron beams. In the outer edge section in contact with the space area, the exposure levels of the electron beams at the outline portion which is far away from the outline portion positioned at the center of the outer edge section along the outer edge section are set higher than that of the outline portion which is nearer to the specified outline portion so that the energy irradiation levels of the electron beams become higher at the outline portion which is far away from the center outline portion along the outer edge section.

13 Claims, 10 Drawing Sheets

Figure 3:
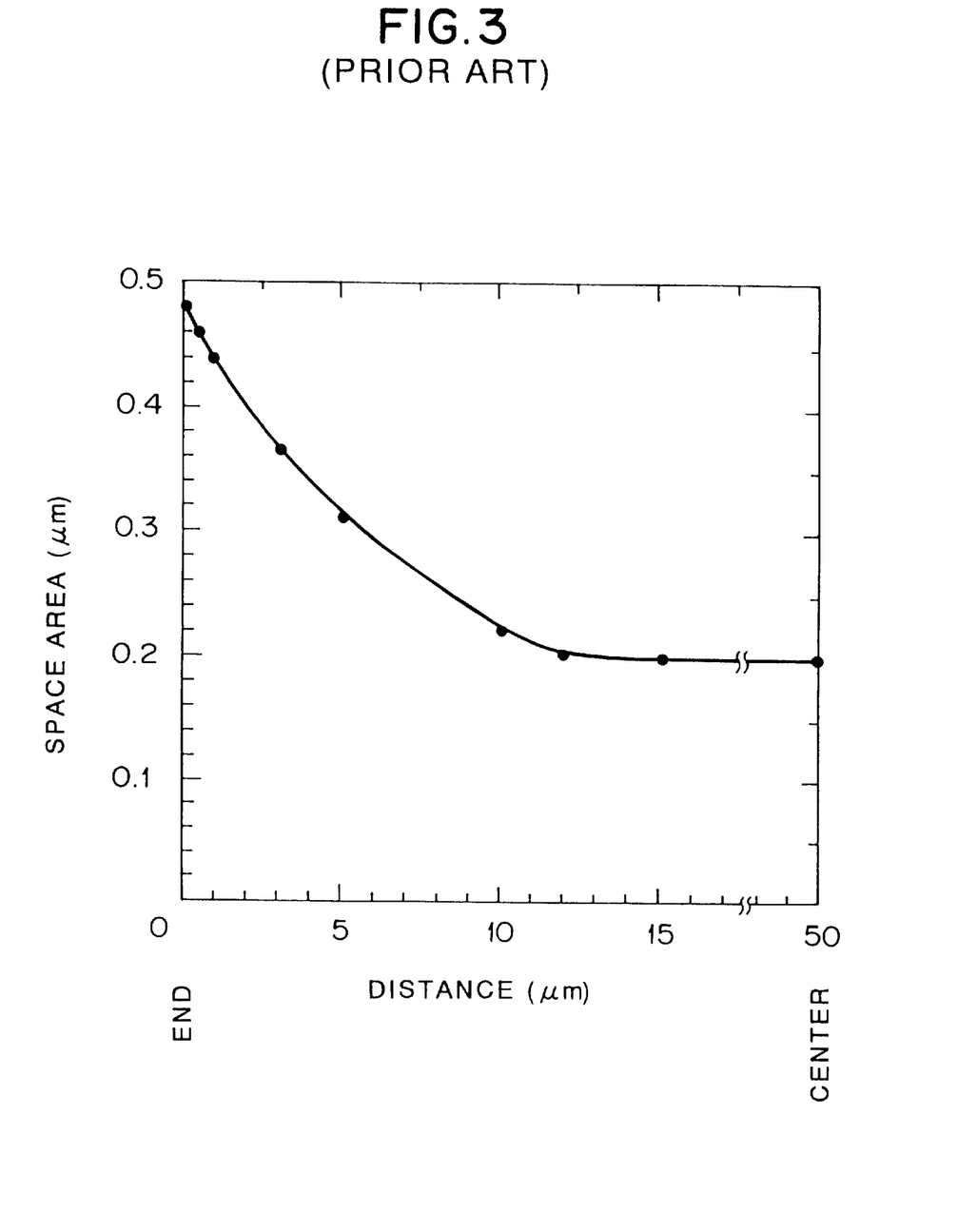
FIG. 3 is a graphical representation for showing variations of the width of a space area according to a prior-art technique.

FIG.10 ed on the prior-art example. As shown in FIG. 3, under an exposure condition that the width of the space area at the center portion is a design size of 0.2 μm, the width of the space area becomes larger from a position of about 10 μm distance from the end portion toward the end portion of the space area. Then, the width of the space area 33 at its end portion is larger than that at the center portion by 0.3 μm or more. When such a size variation occurs, there arises a significantly serious problem that the properties of the semiconductor device change.

PATTERN DRAWING METHOD USING CHARGED PARTICLE BEAMS

BACKGROUND OF THE INVENTION

1. Field of the Invention

The present invention relates to a pattern drawing method using charged particle beams for forming a fine pattern on a semiconductor substrate, and relates, more particularly, to a pattern drawing method using charged particle beams for forming a fine pattern by dividing the pattern to be drawn into a central section and an outer edge section surrounding the central section and irradiating charged particle beams to these sections separately, and an apparatus for the pattern drawing method.

2. Description of the Related Art

Figure 1:
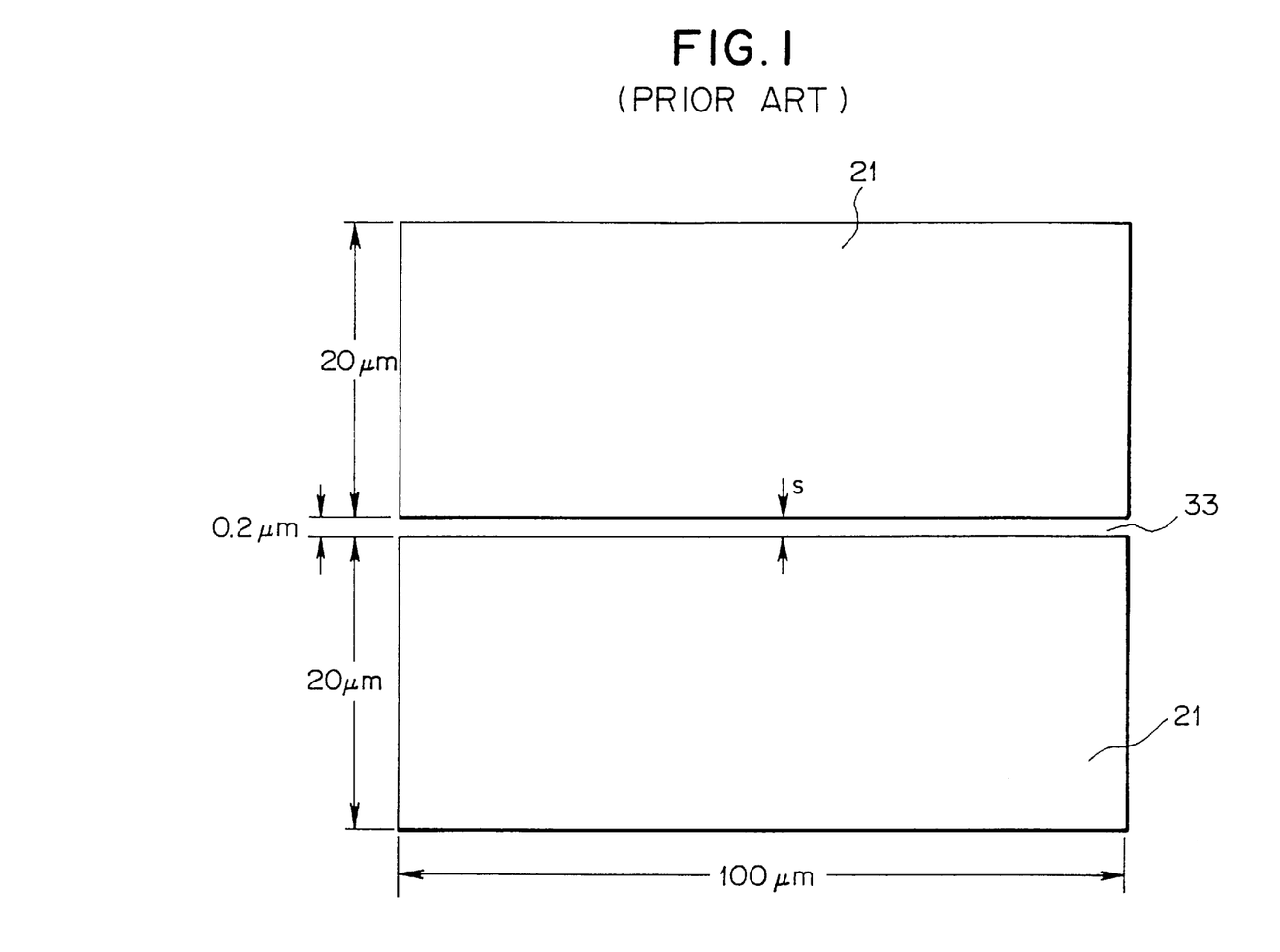
FIG. 1 is a schematic diagram for showing a pattern to be drawn.

Along with the advancement of LSIs, there have been progressed rapidly methods for providing fine patterns to be used for semiconductor devices. In order to manufacture a semiconductor device having an inter-pattern distance of 0.25 μm or less which is required from now on, a pattern drawing method using charged particle beams is an effective method. FIG. 1 is a schematic diagram for showing a pattern to be drawn. Two rectangular pattern scheduled areas 21 having 20 μm as a short side length and 100 μm as a long side length are provided with their long sides set parallel with each other and with a 0.2 μm distance between these two areas. A pattern is scheduled to be drawn in these pattern scheduled areas 21 by using electron beams. In other words, there is provided a space area 33 in which no pattern is scheduled to be formed between the pattern scheduled areas 21.

This, however, has a problem in that when electron beams of the same dose is applied uniformly to these pattern scheduled areas 21, the space area 33 is buried by the pattern. This is a phenomenon which occurs due to a dispersion of electron beams within a resist and on the surface of a substrate, the so-called proximity effect. This problem then becomes more serious as the pattern to be drawn becomes more minute.

Figure 2:
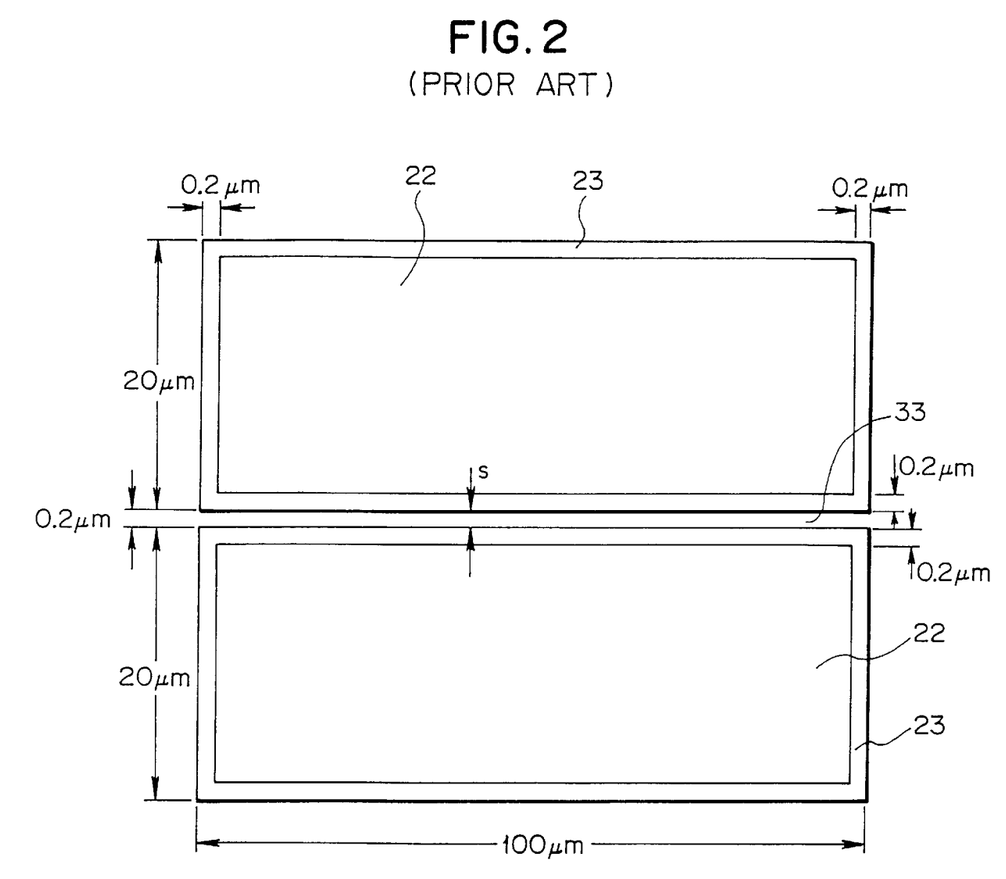
FIG. 2 is a schematic diagram for showing a pattern to be drawn divided into an outer edge section and a central section.

Under the above circumstances, there has been proposed a method for dividing each of the pattern scheduled areas 21 into an outer edge section for forming an outer edge of this area and a central section surrounded by the outer edge section, and for setting the dose in the outer edge section to be higher than that of the central section. FIG. 2 is a schematic diagram for showing a pattern to be drawn divided into the outer edge section and the central section. As shown in FIG. 2, each of the two pattern scheduled areas 21 shown in FIG. 1 is divided into an outer edge section 23 having a width of 0.2 μm provided at the outer periphery of the area and a central section 22 surrounded by the outer edge section 23. The beam exposure level in the outer edge section 23 is set higher than that in the central section 22, and electron beams are applied to these areas individually to form a pattern in each area.

This method, however, also has a problem in that the width of the space area 33 becomes larger at a position of the space area 33 far from its center portion in the longitudinal direction. FIG. 3 shows variations of the width of the space area 33 when a pattern is formed in the manner as described above by coating a negative resist of a thickness 0.5 μm on a silicon substrate. FIG. 3 is a graphical representation for showing a relationship between a distance from the end portion to the center portion of the space area in the longitudinal direction as expressed in the horizontal axis and the width of the space area as expressed in the vertical axis, There has been proposed a pattern drawing apparatus for preventing an excess exposure in the contacting portion when two pattern scheduled areas are contacted with each other (Japanese Unexamined Patent Publication (Kokai) No. Hei 5-217869). According to this prior-art technique, when two pattern scheduled areas are contacted with each other, the lengths of the sides of these areas forming the contacting portion are compared, and the exposure of electron beams to the outer edge section corresponding to the side having a shorter length is omitted. With this arrangement, a reduction in the drawing accuracy due to excess dosage can be prevented as compared with the case where electron beams are applied to all the outer edge sections of each area.

There has also been proposed a pattern drawing method for adjusting the width of the outer edge section according to the pattern scheduled area (Japanese Unexamined Patent Publication (Kokai) No. Sho 59-167018). In this prior-art technique, a leakage of cumulated energy of electron beams to the outside of the pattern scheduled area is prevented by adjusting the width of the outer edge section according to the size of the pattern scheduled area. With this arrangement, the accuracy of drawing a pattern can be improved.

However, the phenomenon of the expansion of the width of the space area can not be prevented sufficiently even by these methods.

SUMMARY OF THE INVENTION

It is an object of the present invention to provide a pattern drawing method using charged particle beams capable of forming an area sandwiched by pattern areas in high accuracy and an apparatus for this purpose.

A pattern drawing method using charged particle beams relating to the present invention has a step of dividing an area to be formed a pattern into a central section and an outer edge section which is divided into a plurality of outline portions surrounding the central section, and a step of irradiating charged electron beams to each of these outline portions in such a way that the outline portion which is far away from a specified outline portion along the outer edge section is irradiated with an dose higher than that of the outline portion which is nearer to the specified outline portion.

Another pattern drawing method using charged particle beams relating to the present invention has a step of dividing each of two areas to be formed a pattern into a central section and an outer edge section which is divided into a plurality of outline portions surrounding the central section, a step of calculating a distance between these pattern areas, and a step of irradiating charged electron beams to each of these outline portions in such a way that the outline portion which is far away from a specified outline portion along the outer edge section is irradiated with a dose higher than that of the outline portion which is nearer to the specified outline portion, when the distance is equal to or less than a predetermined value.

According to the present invention, since the dose of the charged particle beams to be irradiated to the outline portions which is far away from a specified outline portion along the outer edge section is higher than that of the outline portion which is nearer to the specified outline portion, it becomes possible to reduce the variations of the width of the area sandwiched between the two pattern areas to thereby form a desired pattern in high accuracy.

A pattern drawing apparatus using charged particle beams relating to the present invention has a generating source for generating charged electron beams, a dividing unit for dividing an area to be formed a pattern and a controlling unit for controlling dose of the charged electron beams. The area to be formed a pattern is divided into a central section and an outer edge section which is divided into a plurality of outline portions surrounding this central section by the dividing unit. The charged electron beams are irradiated to each of these outline portions in such a way that the outline portion which is far away from a specified outline portion along the outer edge section is irradiated with a dose higher than that of the outline portion which is nearer to the specified outline portion by the controlling unit.

According to the present invention, since the pattern drawing apparatus has the controlling unit for setting the dose of the charged particle beams to be irradiated to the outline portions to be higher at the outline portion which is far away from a specified outline portion along the outer edge section than that of the outline portion which is nearer to the specified outline portion, when two pattern areas are to be drawn, it becomes possible to reduce the variations of the width of the area sandwiched by these two pattern areas, and thus, a desired pattern can be formed in high accuracy.

DESCRIPTION OF THE PREFERRED EMBODIMENTS

Figure 4A:
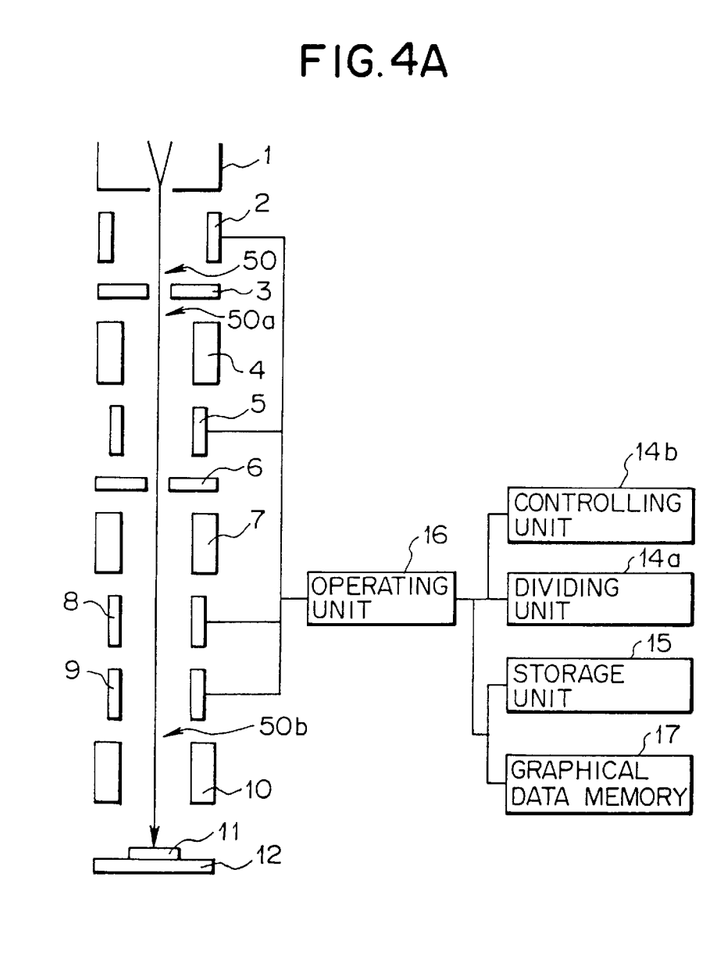
FIG. 4A is a schematic diagram for showing a pattern drawing apparatus relating to an embodiment of the present invention.
Figure 4B:
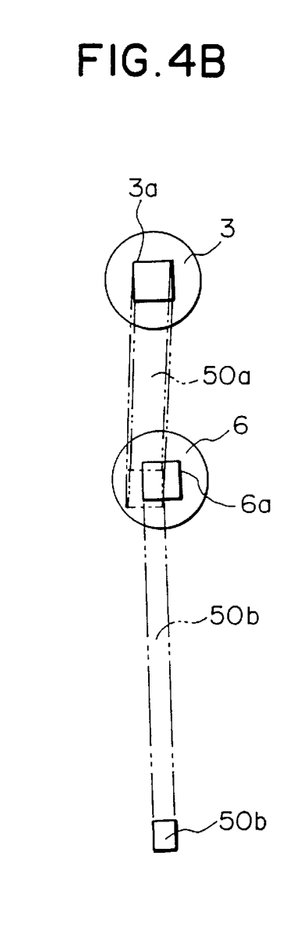
FIG. 4B is a schematic diagram for showing a stroke of electron beams passing through apertures.

Embodiments of the present invention will be explained below in detail with reference to attached drawings. FIG. 4A is a schematic diagram for showing a pattern drawing apparatus relating to an embodiment of the present invention, and FIG. 4B is a schematic diagram for showing a stroke of electron beams passing through apertures. In the pattern drawing apparatus relating to the present embodiment, a stage 12 on which a semiconductor wafer 11 is to be mounted is provided, and an electron gun 1 for generating electron beams 50 to be irradiated on to the semiconductor wafer 11 is disposed above the stage 12. Between the electron gun 1 and the stage 12, there are disposed in sequence from the top, a blanking electrode 2 for on/off controlling the irradiation of the electron beams 50 on to the semiconductor wafer 11, a first aperture 3 having a square-shaped opening 3a for changing the electron beams 50 into electron beams 50a having a square cross sectional shape, a forming lens 4 for restricting an expansion of the electron beams 50a having passed through the first aperture 3, a forming deflector 5 for deflecting the electron beams 50a, a second aperture 6 having a square-shaped opening 6a for changing the electron beams 50a into electron beams 50b having a smaller cross sectional area, a demagnified lens 7 for demagnifying the electron beams 50b to be irradiated on the wafer 11, a main deflector 8 and a sub deflector 9 for deflecting the electron beams 50b respectively, and a projection lens 10 for controlling the focus of the electron beams 50b. The blanking electrode 2, the forming deflector 5, the main deflector 8 and the sub deflector 9 are connected respectively to an operating unit 16 for operating the operation of these units. Furthermore, a storage unit 15 for storing graphical data of a pattern to be drawn, a dividing unit 14a for dividing an area to be formed the pattern into outline portions and a central section, a controlling unit 14b for controlling the dose of electron beams to be irradiated with the graphical data and a graphical data memory 17 for storing graphical data are connected to the operating unit 16 respectively.

Figure 5:
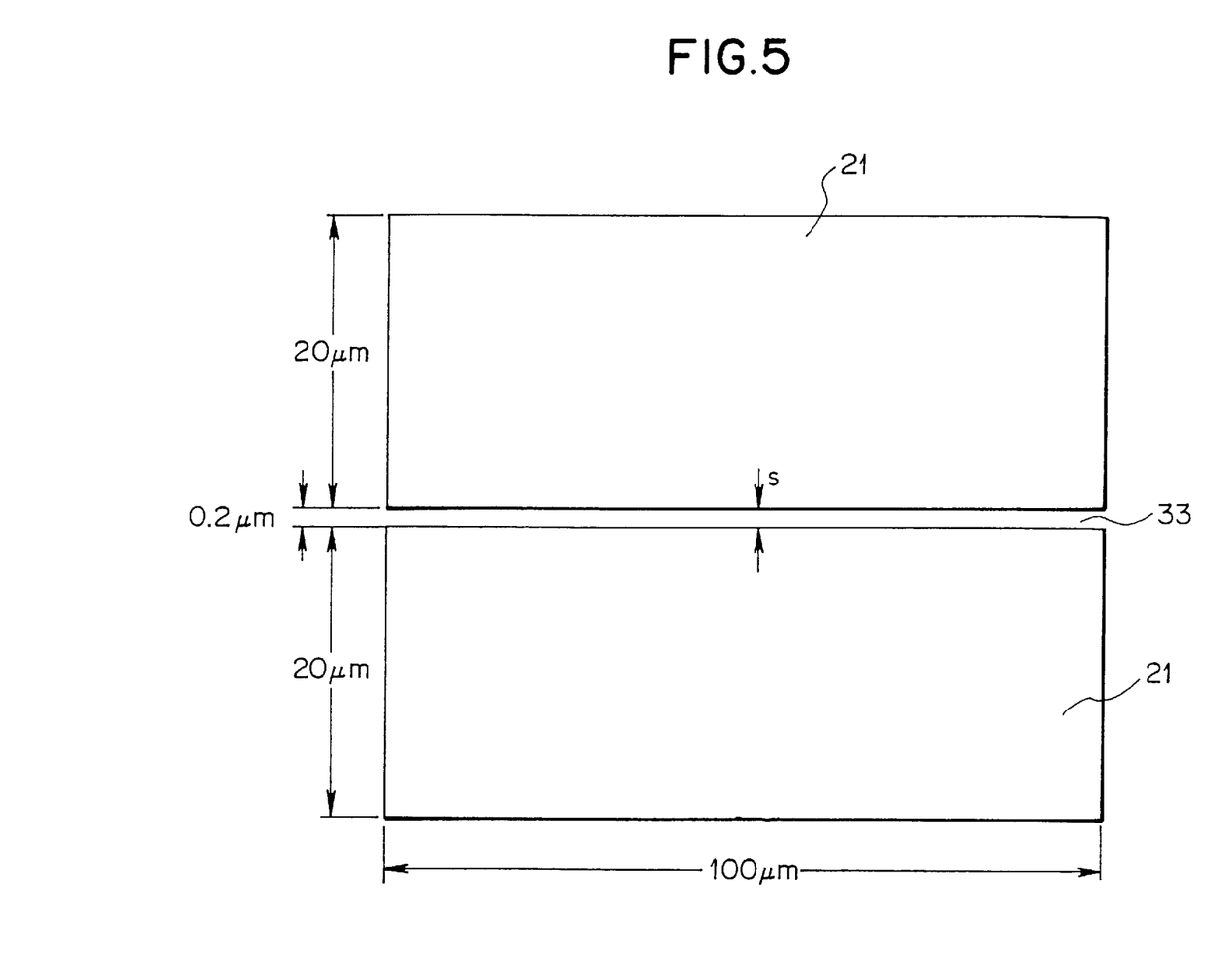
FIG. 5 is a schematic diagram for showing a pattern to be drawn.
Figure 6:
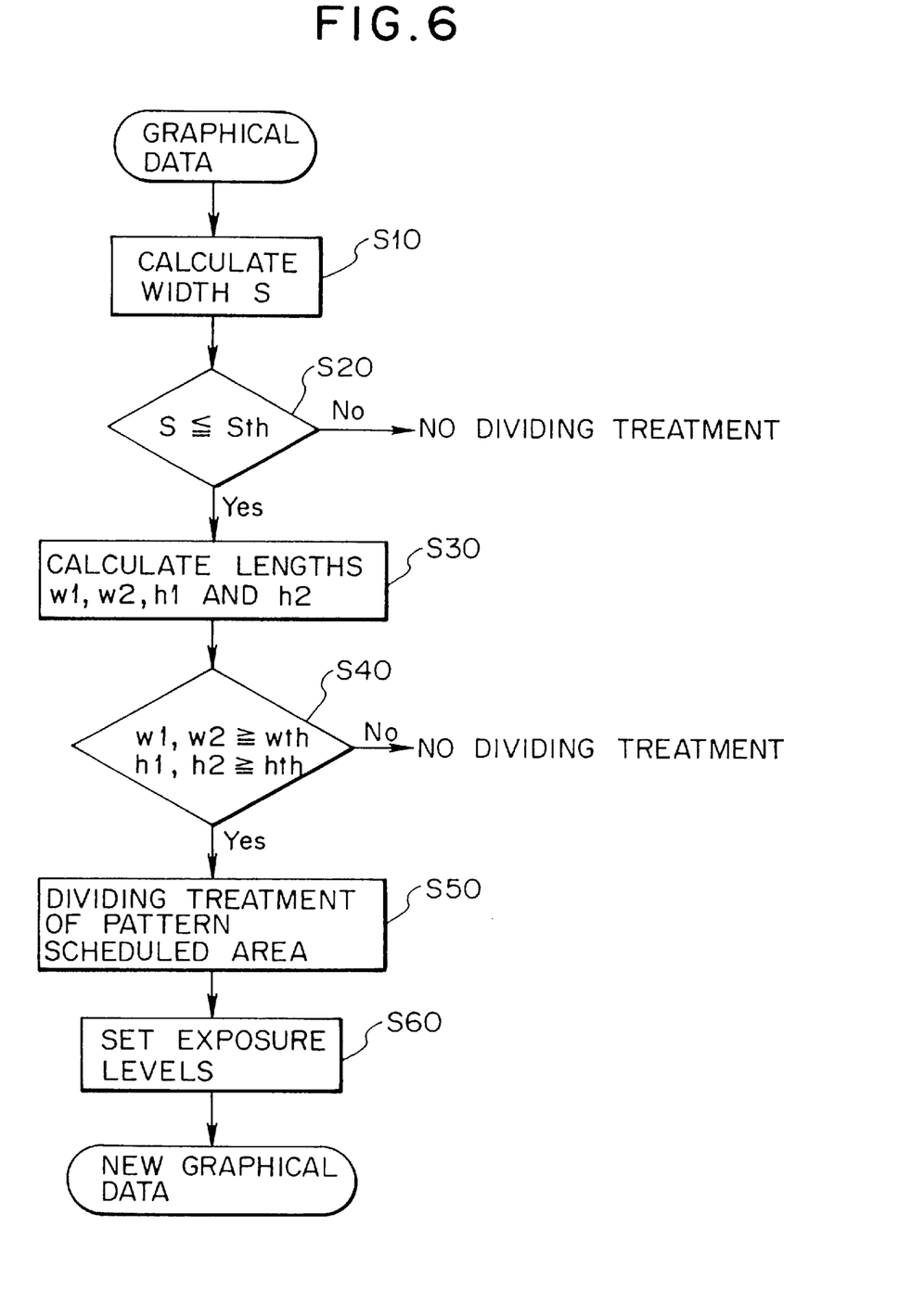
FIG. 6 is a flow chart for showing a pattern drawing method relating to a first embodiment of the present invention.

A pattern drawing method using the pattern drawing unit having the above-described structure will be explained next. FIG. 5 is a schematic diagram for showing a pattern to be drawn. The pattern shown in FIG. 5 is the same as that shown in FIG. 1, and therefore, their detailed explanation will be omitted. FIG. 6 is a flow chart for showing a pattern drawing method relating to a first embodiment of the present invention. First, graphical data of a pattern to be drawn that has been stored in the storage unit 15 is stored in the graphical data memory 17. Then, a width S of the space area 33 is calculated (step S10). In the present embodiment, the width S is constant as 0.2 $\mu$m.

Next, in the space area 33, a position at which the width S is equal to or less than a first reference value Sth is detected (step S20). The first reference value Sth is 0.2 $\mu$m, for example. In the present embodiment, the width S is equal to or less than the first reference value Sth at all positions.

Then, lengths w1 and w2 of the sides of the pattern scheduled areas 21 which are in contact with the space area 33 and lengths h1 and h2 of the sides orthogonal with these sides are calculated (step S30). In the present embodiment, the lengths w1 and w2 are 100 $\mu$m respectively and the lengths h1 and h2 are 20 $\mu$m respectively.

Next, a decision is made as to whether or not the lengths w1 and w2 are equal to or over a second reference value wth and whether or not the lengths h1 and h2 are equal to or over a third reference value hth (step S40). The second reference value wth is 30 $\mu$m, for example, and the third reference value hth is 10 $\mu$m, for example.

Figure 7:
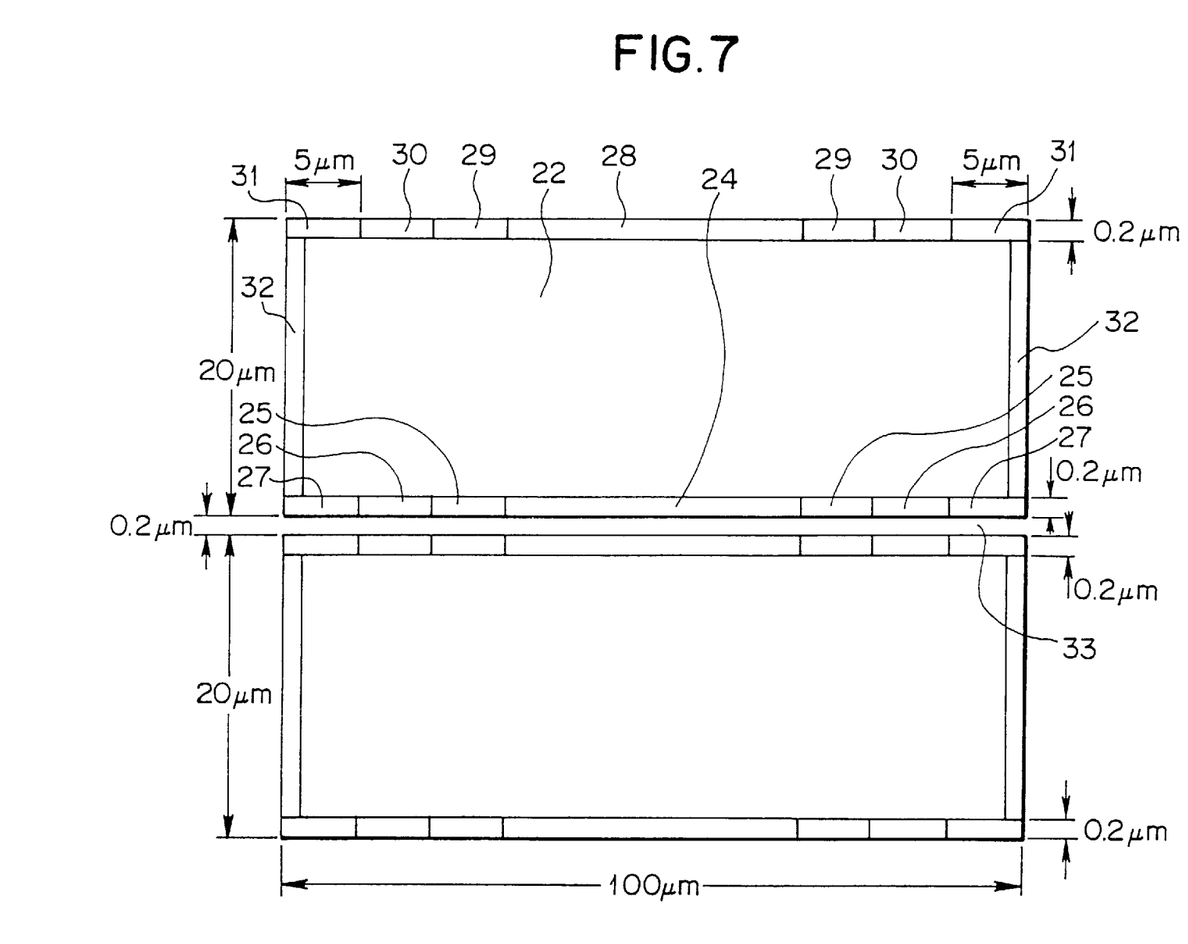
FIG. 7 is a schematic diagram for showing a dividing treatment of a pattern to be drawn in the first embodiment.

If the lengths w1 and w2 are equal to or over the second reference value wth and the lengths h1 and h2 are equal to or over the third reference value hth, a dividing treatment of the pattern scheduled areas 21 is carried out (step S50) by dividing unit 14a. FIG. 7 is a schematic diagram for showing a dividing treatment of a pattern to be drawn in the first embodiment. In the present embodiment, each of the pattern scheduled areas 21 is divided into the outer edge section provided at the outer edge to have a width 0.2 μm and the central section 22 surrounded by the outer edge section. Furthermore, the contacting portion of the outer edge section in contact with the space area 33 is divided sequentially into outline portions 27, 26 and 25 at every 5 μm from both end positions of the contacting portion, and an outline portion 24 is provided at a position in the contacting portion sandwiched between the outline portions 25. Similarly, the portion parallel with the contacting portion in contact with the space area 33 is divided sequentially into outline portions 31, 30 and 29 at every 5 μm from both end positions of the portion, and an outline portion 28 is provided between the outline portions 29. Further, an outline portion 32 is provided in each outer edge section orthogonal with the contacting portion.

Next, a suitable dose to each of the divided outline portions is controlled by the controlling unit 14b based on the intensity of the electron beams (step S60). In the contacting portion 24 of the outer edge section in contact with the space area 33 and in the portion 28 parallel with the contacting portion 24, doses of electron beams at the outline portion which is far away from the outline portions 24 and 28 respectively are set to be gradually larger than that at the outline portion which is nearer to the outline portions 24 and 28, so that the energy irradiation volume of the electron beams at the outline portion which is far away from the centrally positioned outline portions 24 and 28 respectively becomes larger than that at the outline portion which is nearer to the outline portions 24 and 28. The set value of doses at each position in the present embodiment is shown in Table 1 below.

TABLE 1

| Position | dose ($\mu C/cm^2$) |
|---|---|
| Central section 22 | 20.0 |
| Outline portions 24, 28 | 24.0 |
| Outline portions 25, 29 | 24.4 |
| Outline portions 26, 30 | 28.0 |
| Outline portions 27, 31 | 32.8 |
| Outline portions 32 | 33.0 |

After the graphical data of the pattern scheduled areas 21 and the dose in each outline portion have been stored as a new graphical data in the memory 17, they are transferred to the operating unit 16.

Then, the electron beams 50 are irradiated from the electron gun 1 as the generation source, and the operations of the blanking electrode 2, the forming deflector 5 and the main deflector 8 and the sub deflector 9 are controlled for one shot each by the operating unit 16, so that electron beams 50b of the dose set for each outline portion are irradiated. By repeating this operation, one latent image pattern is drawn on the surface of the semiconductor wafer 11 coated with a resist.

Figure 8:
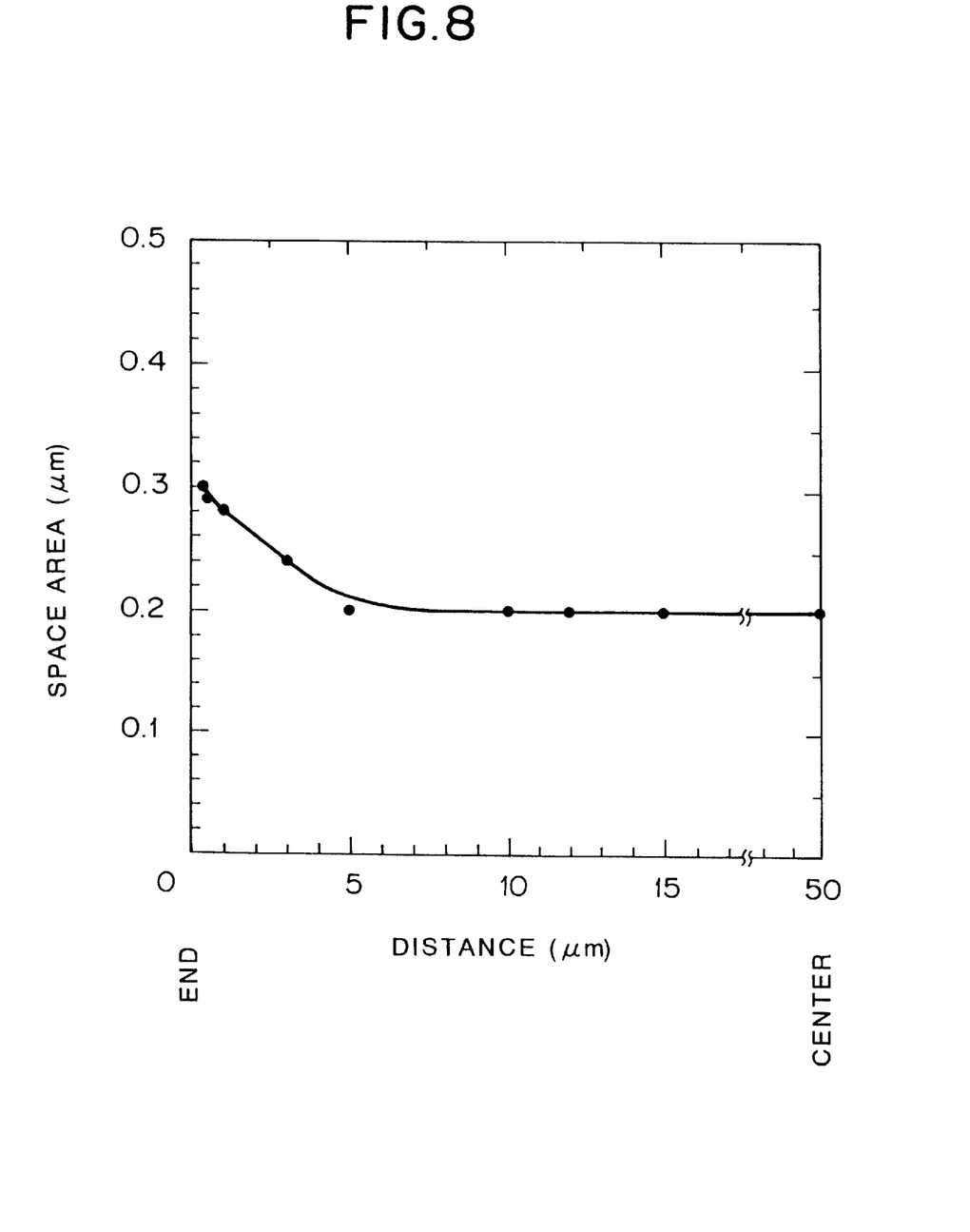
FIG. 8 is a graphical representation for showing variations of the width of the space area in the first embodiment.

FIG. 8 shows variations of the width of the space area 33 when a pattern is drawn in the manner as described above by coating a negative resist of the thickness 0.5 μm on a silicon substrate. FIG. 8 is a graph representation for showing a relationship between the distance from the end portion to the center portion of the space area in the longitudinal direction as expressed in the horizontal axis and the width of the space area as expressed in the vertical axis, in the first embodiment. According to the present embodiment, the difference between the width at the end portion of the space area 33 and the width at the center portion of the space area 33 is only about 0.1 μm, as shown in FIG. 8. Since the width of the space area 33 at its end portion is larger than that at the center portion by 0.3 μm or more in the case of the conventional pattern drawing method as shown in FIG. 3, it is possible to restrict the variation in the width of the space area to an extremely small level by the present embodiment.

The above-described dividing treatment is not carried out at a position where the width S is larger than the first reference value Sth in the step S20, and electron beams are irradiated in a similar manner to the central section 22. The dividing treatment is not carried out when the length w1 or w2 is less than the second reference value wth or when the length h1 or h2 is less than the third reference value hth in the step S40 either.

Figure 9:
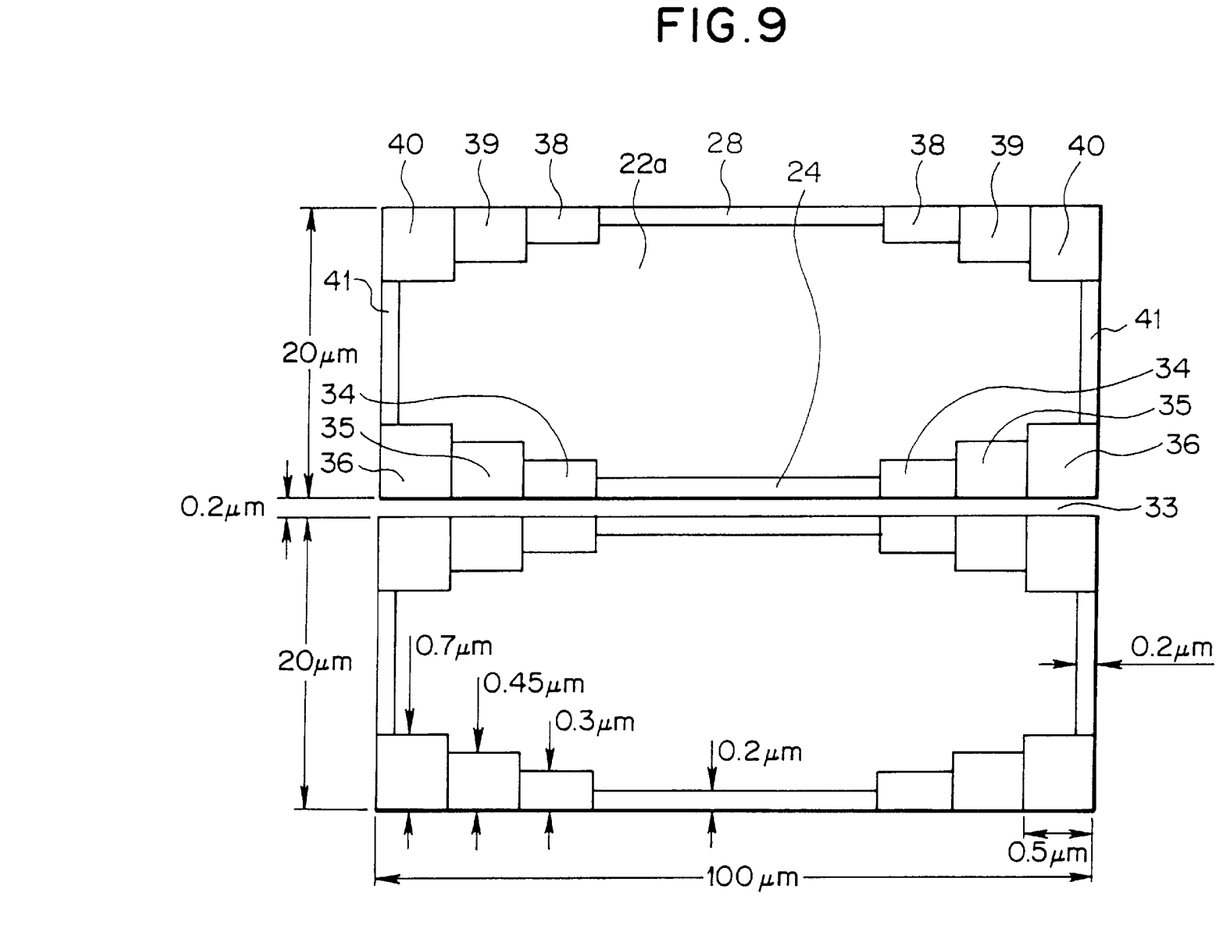
FIG. 9 is a schematic diagram for showing a dividing treatment of a pattern to be drawn in a second embodiment.

A second embodiment of the present invention will be explained next. The pattern shown in FIG. 5 is also to be drawn in the present embodiment. In the present embodiment, a latent image pattern is drawn in the same manner as that in the first embodiment, except that the dose is set at a constant value for the whole pattern and that the method of dividing the area for the pattern to be drawn following the set dose is different from that of the first embodiment. FIG. 9 is a schematic diagram for showing the dividing treatment of the pattern to be drawn in the second embodiment. In the present embodiment, electron beams are irradiated by setting the dose at a constant value of 22.4 $\mu C/cm^2$. For this purpose, in the contacting portion of the outer edge section in contact with the space area 33 and in the portion parallel with the contacting portion, the widths of the outline portions which are far away from the outline portions 24 and 28 respectively are set to be gradually larger than that of the outline portion which is nearer to the outline portions 24 and 28 so that the energy irradiation volume of the electron beams at the outline portion which is far away from the centrally positioned outline portions 24 and 28 respectively becomes larger than that of the outline portion which is nearer to the outline portions 24 and 28. Thus, the shape of a central section 22a is different from that of the central section 22. The width of each outline portion in the present embodiment is shown in Table 2 below.

TABLE 2

| Outline portion | width ($\mu$m) |
|---|---|
| 33, 37 | 0.2 |
| 34, 38 | 0.3 |
| 35, 39 | 0.45 |
| 36, 40 | 0.7 |

Figure 10:
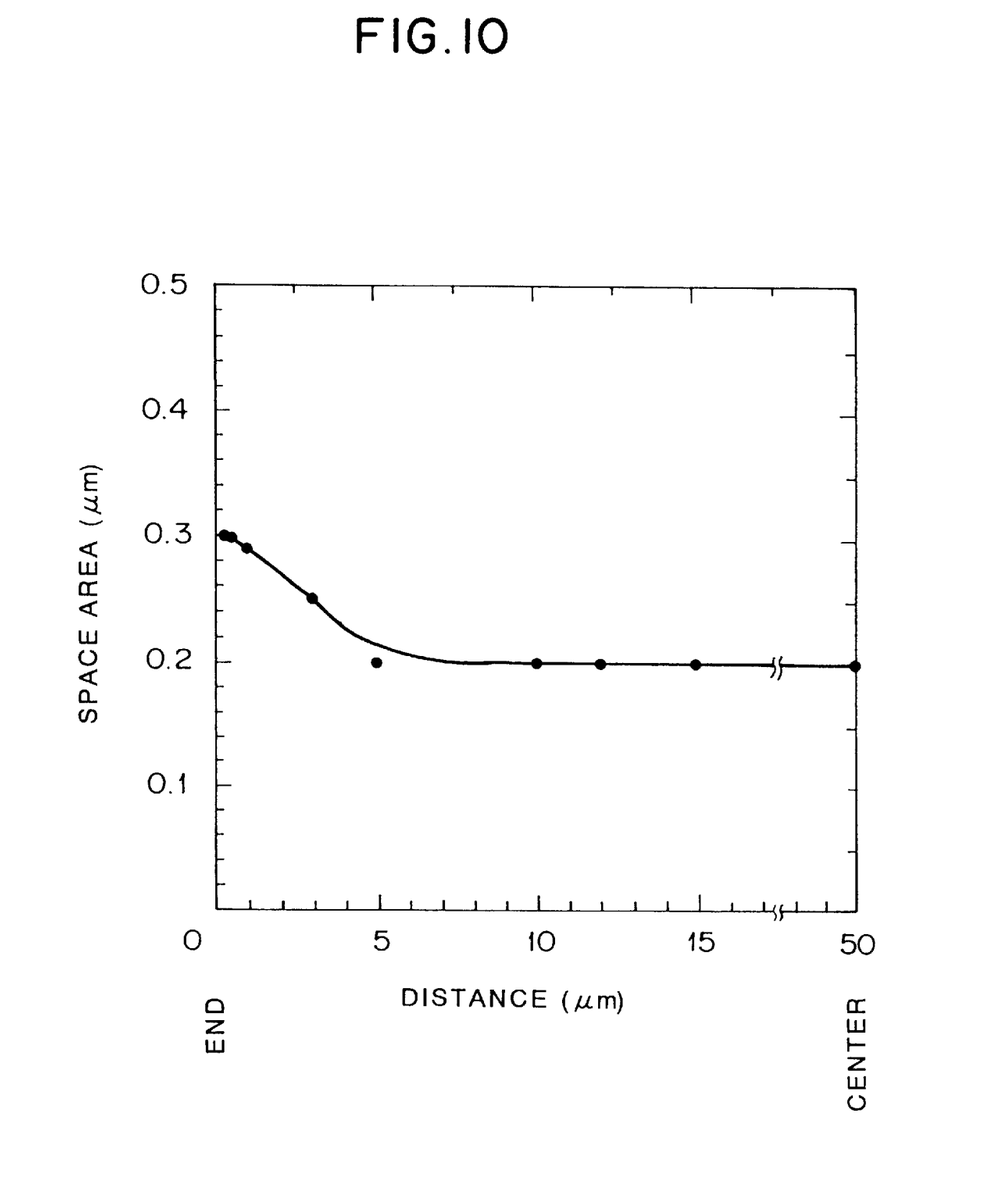
FIG. 10 is a graphical representation for showing variations of the width of the space area in the second embodiment.

FIG. 10 shows variations of the width of the space area 33 when a pattern is drawn in the manner as described above by coating a negative resist of the thickness 0.5 μm on a silicon substrate. FIG. 10 is a graph representation for showing a relationship between the distance from the end portion to the center portion of the space area 33 in the longitudinal direction as expressed in the horizontal axis and the width of the space area as expressed in the vertical axis, in the second embodiment. According to the present embodiment, the difference between the width at the end portion of the space area 33 and the width at the center portion of the space area 33 is only about 0.1 μm, as shown in FIG. 10. Since the width of the space area at its end portion is larger than that at the center portion by 0.3 µm or more in the case of the conventional pattern drawing method as shown in FIG. 3, it is possible to restrict the variation in the width of the space area to an extremely small level by the present embodiment in a manner similar to that of the first embodiment.

In the first and second embodiments, although the outer edge sections in contact with the space area are divided at every 5 µm and the exposure levels of electron beams or the widths of the outline portions are varied in four stages, the present invention is not limited to them. The width of division and the number of the division may also be varied according to the pattern to be drawn and the size of the space area.

Furthermore, the dose of electron beams to be irradiated to the pattern scheduled areas may also be controlled by combining the first and second embodiments.

What is claimed is:

1. A pattern drawing method using charged particle beams comprising the steps of:

dividing an area which is to be formed with a pattern, into a central section and an outer edge section surrounding said central section, said outer edge section being further divided into a plurality of outline portions; and irradiating with charged particle beams each of said outline portions, one outline portion of said outer edge section being irradiated with an energy level higher than a dose that irradiates another outline portion which is nearer to a specified outline portion of said outer edge section.

2. A pattern drawing method using charged particle beams according to claim 1, wherein said area to be formed with a pattern has at least one side, and said specified outline portion is substantially at a center outline portion of said side.

3. A pattern drawing method using charged particle beams according to claim 1, wherein the step of irradiating with said charged particle beams includes a further step of irradiating said one outline portion with a dose higher than a dose of said another outline portion which is nearer to said specified outline portion.

4. A pattern drawing method using charged particle beams according to claim 1, wherein the step of dividing said area to be formed with a pattern sets on area size of each of said outline portions, said one outline portion being larger than said another outline portion which is nearer to said specified outline portion.

5. A pattern drawing method using charged particle beams according to claim 1, wherein said one outline portion is irradiated with a dose higher than a dose of said another outline portion which is nearer to said specified outline portion, and the step of dividing said area to be formed with a pattern sets an area size of each of said outline portions, said one outline portion is set larger than said another outline portion which is nearer to said specified outline portion.

6. A pattern drawing method using charged particle beams according to claim 1, wherein said charged particle beams are electron beams.

7. A pattern drawing method using charged particle beams comprising the steps of:

dividing each of two areas, which are to be formed each with a respective pattern, into a central section and an outer edge section surrounding said central section, said outer edge section being further divided into a plurality of outline portions;

calculating a distance to be between said two areas; and irradiating with charged particle beams each of said outline portions, in each said area, one said outline portion of said outer edge section being irradiated with a dose higher than a dose that irradiates another outline portion which is nearer to a specified outline portion, when said distance is equal to or less than a predetermined value.

8. A pattern drawing method using charged particle beams according to claim 7, wherein at least one said area to be formed with a pattern has at least one side, and said specified outline portion of said at least one area is positioned substantially at a center portion of said side.

9. A pattern drawing method using charged particle beams according to claim 7, wherein said specified outline portions of each said area face each other.

10. A pattern drawing method using charged particle beams according to claim 7, wherein in each said area said one outline portion is irradiated with a dose higher than a dose of said another outline portion which is nearer to said specified outline portion.

11. A pattern drawing method using charged particle beams according to claim 7, wherein the step of dividing said areas to be formed with a pattern sets an area size of each of said outline portions, in each said area said one outline portion being larger than said another outline portion which is nearer to said specified outline portion.

12. A pattern drawing method using charged particle beams according to claim 7, wherein in each said area said one outline portion is irradiated with a dose higher than a dose of said another outline portion which is nearer to said specified outline portion, and the step of dividing said areas, each to be formed with a respective pattern, sets an area size of each of said outline portions, in each said area said one outline portion is set larger than said another outline portion which is nearer to said specified outline portion.

13. A pattern drawing method using charged particle beams according to claim 7, wherein said charged particle beams are electron beams.

* * * * *